(12) United States Patent
Ishizuka

(10) Patent No.: US 7,612,572 B2
(45) Date of Patent: Nov. 3, 2009

(54) PROBE AND METHOD OF MANUFACTURING A PROBE

(75) Inventor: Toshihiro Ishizuka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 230 days.

(21) Appl. No.: 11/482,848

(22) Filed: Jul. 10, 2006

(65) Prior Publication Data
US 2007/0200582 A1 Aug. 30, 2007

(30) Foreign Application Priority Data
Feb. 15, 2006 (JP) .............................. 2006-038066

(51) Int. Cl.
*G01R 31/02* (2006.01)
*G01R 31/28* (2006.01)
(52) U.S. Cl. ...................................................... 324/761
(58) Field of Classification Search ......... 324/754–755; 438/14, 8; 257/48
See application file for complete search history.

(56) References Cited

U.S. PATENT DOCUMENTS
6,072,321 A * 6/2000 Akram et al. ............... 324/754

FOREIGN PATENT DOCUMENTS
| JP | 11-51970 | 2/1999 |
|---|---|---|
| JP | 2000-227444 | 8/2000 |
| JP | 2000-346897 | 12/2000 |

* cited by examiner

*Primary Examiner*—Ha Tran T Nguyen
*Assistant Examiner*—Trung Q Nguyen
(74) *Attorney, Agent, or Firm*—Fujitsu Patent Center

(57) ABSTRACT

A probe 10 to be used when inspecting characteristics of an object of inspection includes: a bar-shaped base member 3 forming a main body; a nickel plating layer 4 constituting a ground layer and a gold plating layer 5 constituting an outermost layer formed on a surface of the base member 3; and a plurality of square-pyramidal 1 protrusions formed in a lattice-like fashion at one end of the base member 3 and brought into contact with the object of inspection.

5 Claims, 9 Drawing Sheets

PROBE AND METHOD OF MANUFACTURING A PROBE

BACKGROUND OF THE INVENTION

The invention relates to a probe for use in an inspection device for inspecting the electrical characteristics of a circuit board, etc. and to a method of manufacturing the probe.

As probes, a spring probe and a cantilever probe are known. The spring probe is brought into contact with an electrode, etc. to measure electrical characteristics of a circuit board and a device upon their inspection. The cantilever probe is used to intentionally flaw a thin oxide film covering an electrode by means of a pointed portion at the forward end thereof to reduce the contact resistance of the film before measuring the electrical characteristics thereof. As the configurations of the forward end of such the probes, there are known, for example, a flat configuration, a conical configuration, a pyramidal configuration, a rounded configuration, a crown-shaped configuration, and a cup-shaped configuration (see FIG. 9). The probe with the crown-shaped configuration, the cup-shaped configuration, or the like is used mainly for the inspection, for example, of a solder ball on the back surface of an LSI (semiconductor integrated circuit). The probe with any other configuration is adaptable to a wide variety of applications.

As general techniques related to such the probes, techniques disclosed in the following Patent documents 1 through 3 are known.

[Patent document 1] JP 2000-227444 A
[Patent document 2] JP 2000-346897 A
[Patent document 3] JP 11-51970 A

SUMMARY OF THE INVENTION

A probe is brought into contact with an electrode or the like in the inspection of a circuit board or a device. However, when the probe is brought into contact with a flat electrode a large number of times, the plating layer formed at a forward end of the probe is worn. As a result, its contact stability with respect to the electrode deteriorates, resulting in a rather unstable resistance value. To illustrate it more specifically, a metal film, such as an nickel-gold (Ni—Au) plating layer or aluminum layer, is formed by evaporation, sputtering, etc. on the electrode of wiring, a device, or the like on the circuit board constituting an object of inspection, that is, an object of probing. On the other hand, also on a surface of the probe, there is formed a metal film formed of Ni—Au, nickel-rhodium (Ni—Rh), etc. The inspection of the electrode of wiring, etc. on the circuit board is usually completed with one contact. However, the probe is used while usually attached to an inspection device, and is brought into contact with the electrodes of wiring, etc. on circuit boards a very large number of times. As a result, the gold plating layer at the forward end of the probe is worn, and the ground layer is exposed. This means that the gold plating layer, whose electrical resistance is minute, is rubbed off, with the result that contact is effected with a material of high electrical resistance. This constitutes a rather serious problem in a spring probe. For, a change to contact with a material of high electrical resistance makes the contact rather unstable.

Of the conventional probes mentioned above, a probe having a crown-shaped configuration or a plurality of protrusions at its forward end is used to intentionally flaw a thin oxide film covering an electrode by means of the pointed portions at the forward end to thereby reduce the contact resistance thereof before measuring electrical characteristics. Thus, here, it is the technical object to make it possible to effectively scrape away the thin oxide film covering the electrode by means of the forward end portion of the probe, and it is not a primary technical object, as in the case of the spring probe, to delay the wear thereof. However, even in, for example, a cantilever probe, whose use differs from that of the spring probe, a long-term use of the probe becomes possible if it is possible to achieve a reduction in the wear, etc. of the forward end portion.

In view of the problem mentioned above, it is an object of the invention to provide a technique related, in particular, to a spring probe, that enables a probe to be used for a long period of time by delaying the progress of wear of the plating layer at the forward end of the probe, thus providing a probe of high contact stability.

In the invention, the following means are adopted for solving the objects. That is, a probe according to the invention is a probe to be used when inspecting characteristics by being brought into contact with an object of inspection, including: a bar-shaped base member forming a main body; a plating layer formed on a surface of the base member; and a plurality of protrusions formed at one end of the base member and adapted to be brought into contact with the object of inspection.

The probe has at its forward end a plurality of protrusions to be brought into contact with an object of inspection, such as a circuit board. This makes it possible to disperse the load at the time of contact. It is possible to delay the progress of wear of the plating layer formed on the surface of the probe.

The object of inspection means a circuit board, typically a semiconductor integrated circuit, or a device using a semiconductor device, such as a memory. By bringing the probe into contact with the electrode of the object of inspection, it is possible to measure the electrical characteristics of the semiconductor device. The probe according to the invention is particularly suitable for a spring probe. For, in a spring probe, it has conventionally been a problem to be solved how to delay the progress of wear of the plating layer at the forward end of the probe, thus achieving a reduction in wear.

The base member can be formed of a bar-shaped material composed of an iron type steel material, beryllium bronze (BeCu), stainless steel (SUS), etc. Its configuration may be a columnar or a prism-shaped one. Further, the entire base member can be formed by a low-conductive alloy or a low-conductive material. Examples of the low-conductive alloy or the low-conductive material include gold or the like which has low electrical resistance.

The plating layer formed on the base member can be formed of gold (Au), nickel (Ni), rhodium (Rh), etc. It is also possible to form a plurality of plating layers by using those materials. In this case, it is desirable to form the outermost layer of a material of low electrical resistance. For example, it is desirable to form the base member of beryllium bronze, to provide a nickel plating layer on the surface thereof as a ground layer, and further, to provide a gold plating layer on the outer side thereof as the outermost layer.

At one end of the base material, there are formed a plurality of protrusions to be brought into contact with the inspection surface of the object of inspection at the time of inspection. One end portion of the base material, that is, the portion which is at the forward end of the probe and which comes into contact with the object of inspection is called a plunger. When it is said that a plurality of protrusions are formed, it means that a plurality of protrusions are formed at the forward end of one base member. There are no particular limitations regarding the number of protrusions. By increasing the number of protrusions, it is possible to more effectively disperse the load at the time of contact with the object of inspection. It is desirable for the plurality of protrusions to be arranged regularly at predetermined intervals. An example of the regular arrangement of the protrusions is a lattice-like arrangement. As a result, the load at the time of contact with the object of inspection is dispersed uniformly, making it possible to effectively reduce the speed at which the wear of the forward end portion of the probe progresses. It is desirable for the predetermined intervals of the protrusions to be determined based on intervals between apexes of the protrusions, which are the portions to be brought into contact with the object of inspection. Further, it is desirable for the predetermined intervals to be designed based on the configuration, etc. of the electrode constituting the object of inspection.

In the probe according to the invention, it is desirable for the plurality of protrusions to be conical/pyramidal protrusions, which are conical or pyramidal. Examples of the pyramidal configuration include triangular and square pyramids, which, however, should not be construed restrictively. The protrusions may be conical/pyramidal protrusions of the same configuration. Further, the protrusions may be formed by combining different conical/pyramidal protrusions. By forming the protrusions of the same conical/pyramidal protrusions, it is possible to make the heights of their apexes uniform. By combining different conical/pyramidal protrusions, it is possible to vary the apex heights and the distance between the conical/pyramidal protrusions. As a result, it is possible to realize a probe configuration more suited to the object of inspection.

Further, in the probe according to the invention, it is possible for the plurality of protrusions to be formed by conical/pyramidal protrusions of different heights. By forming them as conical/pyramidal protrusions of different heights, it is possible to vary the timings with which the conical/pyramidal protrusions of different heights are respectively brought into contact with the object of inspection. As a result, it is possible to reduce the degree of progress of wear of the plating layers at the forward end of the probe. For example, there are provided two kinds of conical/pyramidal protrusions of different heights. In this case, the apexes of the higher conical/pyramidal protrusions are worn first, and after the apexes of the higher conical/pyramidal protrusions have been worn to a certain degree as a result of use, the apexes of the lower conical/pyramidal protrusions are brought into contact with the object of inspection. That is, at the point in time when the apexes of the lower conical/pyramidal protrusions begin to come into contact with the object of inspection, transition occurs from a state in which the contact contribution of the higher conical/pyramidal protrusions with respect to the object of inspection is high to a state in which the contact contribution of the lower conical/pyramidal protrusions is high. As a result, it is possible to maintain the contact stability of the probe for a long period of time. Further, even if the gold plating layers constituting the outermost layers of the higher conical/pyramidal protrusions are worn away and the nickel plating layers constituting the ground layers are exposed, it is possible to inspect the object of inspection by means of the gold plating layers of the lower conical/pyramidal protrusions. That is, it is possible to perform inspection in a state in which the contact contribution of the gold plating layers as the contact portions with respect to the object of inspection is high.

Further, in the probe according to the invention, it is possible for the conical/pyramidal protrusions to have at their forward ends minute flat portions adapted to come into contact with the inspection surface of the object of inspection so as to be substantially parallel to the inspection surface. Due to the provision of the minute flat portions, it is possible to disperse the load on the probe forward end portion at the time of contact. As a result, it is possible to reduce the speed at which the wear of the plating layer progresses.

Further, the invention is a method of manufacturing a probe equipped with a plurality of protrusions to be brought into contact with an object of inspection, including: a first step of forming a plurality of first groove portions at predetermined intervals at one end of a bar-shaped base member constituting the probe in a direction substantially perpendicular to the longitudinal direction of the base member by using a predetermined working unit; a second step of forming a plurality of second groove portions at predetermined intervals by using the working means so that the second groove portions cross the first groove portions at a predetermined angle; and a third step of forming a plating layer on a surface of the base member.

In the probe manufacturing method according to the invention, it is possible to efficiently manufacture the probe having at the forward end thereof a plurality of protrusions adapted to come into contact with the inspection surface of the object of inspection at the time of inspection.

In the first step, a plurality of first groove portions are formed at predetermined intervals at an end of a bar-shaped base member constituting the probe by using a predetermined working unit in a direction substantially perpendicular to the longitudinal direction of the base member. It is desirable for the first groove portions to be formed linearly. As the predetermined working unit, it is possible to use, for example, a grindstone with a V-shaped section. This grindstone is rotated at high speed, and caused to make a linear reciprocating movement while imparting a predetermined pressurizing force thereto. As a result, it is possible to form the first groove portions.

When forming the first groove portions by means, for example, of a grindstone with a substantially V-shaped section, the first step is conducted as follows. First, the base member is fixed in position by using a jig, and grinding is started by bringing the grindstone into contact with one end surface of the base member fixed in position while rotating it at high speed so as to be substantially perpendicular thereto. After that, the grindstone is caused to make a linear reciprocating movement along one end surface of the base member to form a plurality of first groove portions with a substantially V-shaped section parallel to each other at predetermined intervals. The plurality of first groove portions can be formed one by one at predetermined intervals using a single grindstone. It is also possible to arrange a plurality of grindstones in parallel at predetermined intervals to form the plurality of first groove portions simultaneously. The depth of the first groove portions, in other words, corresponds to the height of a plurality of protrusions formed at the forward end of the probe. Thus, by adjusting the depth of the first groove portions, it is possible to adjust the height of the plurality of protrusions formed at the forward end of the probe.

In the second step, a plurality of second groove portions are parallel formed by using the working unit so that they cross the first groove portions at a predetermined angle. Like the first groove portions, it is desirable for the second groove portions to be formed linearly. The predetermined angle is determined according to the configuration of the protrusions. To be more specific, when the second groove portions are formed so that they cross the first groove portions substantially at 90 degrees, the first groove portions and the second groove portions are orthogonal to each other. As a result, square-pyramidal protrusions are formed between the first groove portions and the second groove portions. The second groove portions can be formed by turning the base member by a predetermined angle. It is also possible to control the working unit by control means to move it to a predetermined position and to form the second groove portions so as to be at the predetermined angle.

In the third step, the plating layer is formed. It is also possible to form a plurality of plating layers. In this case, it is desirable for the material of the outermost layer to be one of low resistance, such as gold.

The probe manufacturing method according to the invention may further include a step in which the second step is repeated according to the configuration of the protrusions. That is, when the configuration of the protrusions is square-pyramidal, the operation of forming a plurality of protrusions can be completed by performing the second step once as described above. When triangular pyramids are to be formed, the second groove portions are first formed, with the predetermined angle in the second step being approximately 60 degrees. Next, the second step is repeated, with the predetermined angle being approximately 120 degrees. This makes it possible to form triangular-pyramidal protrusions.

The probe manufacturing method according to the invention may further include a step in which the base members are closely arranged in a matrix-like fashion. That is, a plurality of the base members are prepared, and are arranged closely in a matrix-like fashion. After that, the first through third steps are executed. As a result, it is possible to manufacture a large number of probes having a plurality of protrusions at their forward ends by a single operation.

Further, in the probe manufacturing method according to the invention, it is possible for the first groove portions to be formed so as to differ in depth from each other in the first step, and it is possible for the second groove portions to be formed so as to differ in depth from each other in the second step. For example, the first groove portions and the second groove portions near the center of the base member are formed to be relatively deep. Further, the first groove portions and the second groove portions on the outer side are formed to be relatively shallow. As a result, it is possible to make the height of the protrusions situated near the center of the base member relatively small.

Further, in the probe manufacturing method according to the invention, the predetermined working unit may be a high voltage wire with a minute sectional area. A high voltage is supplied to a wire with a minute sectional area, and this wire is brought into contact with one end surface of the base member at a predetermined angle to thereby form a notch with a substantially V-shaped section. This makes it possible to form first groove portions and second groove portions with a V-shaped sectional configuration.

In the probe manufacturing method according to the invention, the predetermined working unit may be a cutting tool with a V-shaped sectional configuration. The cutting tool with a V-shaped sectional configuration is brought into contact with one end surface of the base member so as to be substantially perpendicular thereto, and is caused to make a linear reciprocating movement while imparting a pressurizing force thereto. As a result, it is possible to form a groove with a V-shaped sectional configuration.

In accordance with the invention, the progress of the wear of the plating layer at the forward end of the probe is delayed. As a result, it is possible to use the probe for a long period of time, and it is possible to provide a probe of high contact stability and a technique related to a method of manufacturing the probe.

DETAILED DESCRIPTION OF THE INVENTION

Next, embodiments of a probe according to the invention and a method of manufacturing the probe will be described with reference to the drawings.

Embodiment 1

Figure 1:
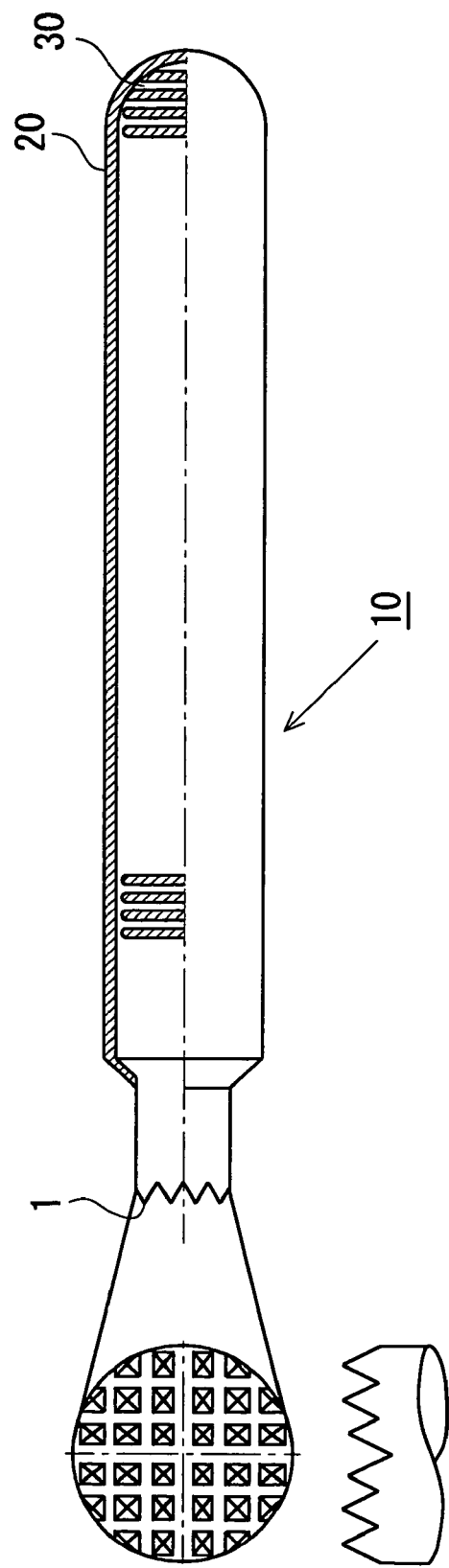
FIG. 1 is a front view of a probe 10 according to a first embodiment.

FIG. 1 is a diagram showing a probe 10 according to a first embodiment. As shown in FIG. 1, a plurality of square-pyramidal protrusions 1 are formed at a forward end of the probe 10 of the first embodiment. A spring 30, which is an elastic member, is connected to the opposite side of the forward end of the probe 10, and these are contained in a cylindrical sleeve 20. In actually using the probe 10, it is attached to an inspection device (not shown) such that longitudinal direction of the sleeve 20 is substantially orthogonal to the inspection surface of the object of inspection, such as a circuit board. Then, the plurality of square-pyramidal protrusions 1 of the probe 10 attached are brought into contact with the inspection surface of the object of inspection. This makes it possible to perform inspection with the probe 10. It is desirable for the diameter of the probe 10 according to the first embodiment to be approximately 0.1 mm to 3.0 mm.

Figure 2A:
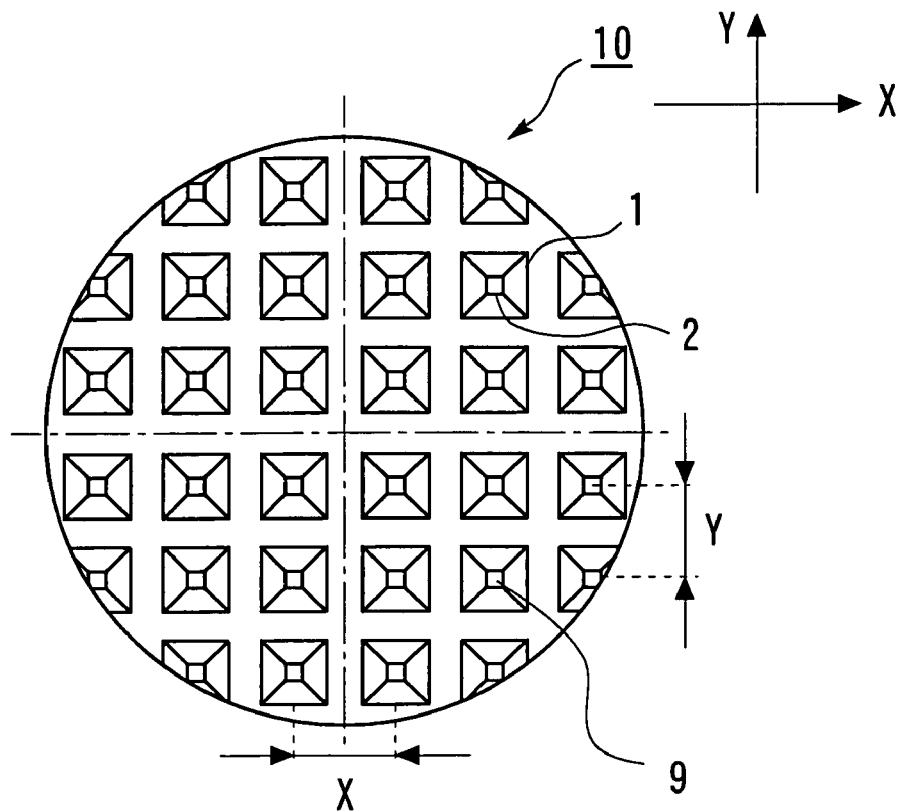
FIG. 2A is an enlarged view of the forward end portion of the probe 10 according to the first embodiment.
Figure 2B:
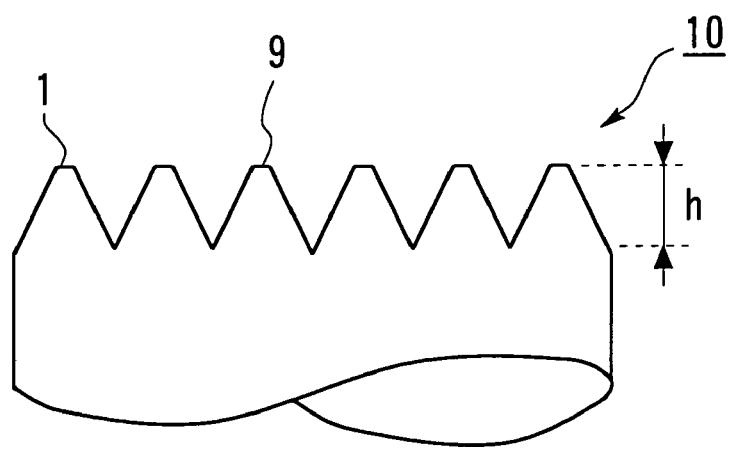
FIG. 2B is an enlarged front view of the probe 10 according to the first embodiment.

Next, the configuration of the forward end portion of the probe 10 of the first embodiment will be described in detail. FIG. 2 are enlarged views of the forward end portion of the probe 10. FIG. 2A is an enlarged view of the forward end portion of the probe 10 according to the first embodiment. FIG. 2B is a front enlarged view of the probe 10 according to the first embodiment. As shown in FIG. 2A, a plurality of square-pyramidal protrusions 1 are formed in a lattice-like fashion at the forward end of the probe 10 according to the first embodiment, in other words, at a forward end of a plunger. The square-pyramidal protrusions 1 of the first embodiment are formed in substantially the same size. The square-pyramidal protrusions 1 correspond to the protrusions of the invention. A distance x between the apexes 2 of the square-pyramidal protrusions 1 in an X-direction and a distance y between the square-pyramidal protrusions 1 in a Y-direction are substantially the same. Further, as shown in FIG. 2B, the square-pyramidal protrusions 1 of the first embodiment are formed in substantially the same height h. In this way, in the probe 10 of the first embodiment, the arrangement distance and the height of the square-pyramidal protrusions 1 are substantially uniform. As a result, it is possible to uniformly disperse the load on the forward end portion of the probe 10 when it is brought into contact with the object of inspection, such as a circuit board. As a result, it is possible to delay the progress of wear of the plating layer formed on the surface of the forward end portion of the probe 10. Further, minute flat portions 9 are formed at the apexes 2 of the square-pyramidal protrusions 1 of the first embodiment. As a result, the contact area with respect to the object of inspection increases, making it possible to more effectively disperse the load at the time of contact with the object of inspection.

Figure 3A:
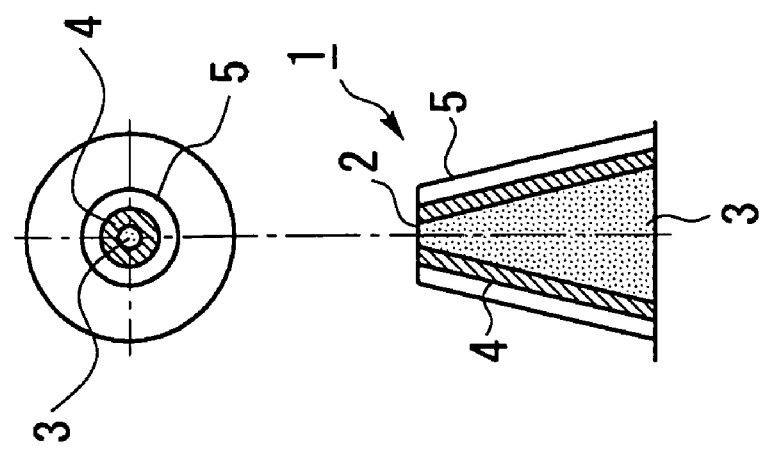
FIG. 3A is an enlarged sectional view of a square-pyramidal protrusion 1 according to the first embodiment prior to wear.
Figure 3B:
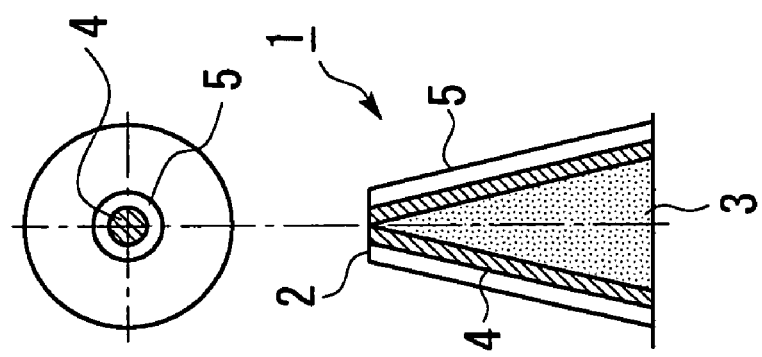
FIG. 3B is an enlarged sectional view of the square-pyramidal protrusion 1 according to the first embodiment in a state in which wear has started.
Figure 3C:
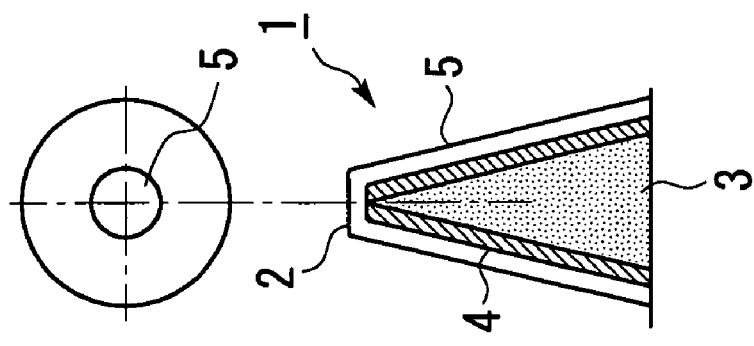
FIG. 3C is an enlarged sectional view of the square-pyramidal protrusion 1 according to the first embodiment in a state in which wear has further progressed.

Here, the wear of the plating layer will be described with reference to the drawings. FIGS. 3A through 3C are enlarged sectional views of the square-pyramidal protrusion 1 according to the first embodiment. FIG. 3A shows a state prior to wear, FIG. 3B shows a state in which wear has started, and FIG. 3C shows a state in which wear has further progressed. As shown in FIG. 3A, the square-pyramidal protrusion 1 of the first embodiment is formed by a base member 3 formed of beryllium bronze, a nickel plating layer 4 formed on the surface of the base member 3, and a gold plating layer 5 formed on the surface of the nickel plating layer 4. As the contact with the object of inspection is repeated, the gold plating layer 5, which is the outermost layer, is worn little by little, and the nickel plating layer 4 constituting the ground layer begins to be exposed. When the contact with the object of inspection is further repeated, the nickel plating layer 4 is also worn, and the exposure of the forward end portion of the base member 3 is to be expected.

In inspecting the object of inspection, it is desirable to bring the gold plating layer 5, which is of the minimum resistance, into contact with the object of inspection. However, when the forward end portion of the probe 10 is repeatedly brought into contact with the object of inspection, wear of the gold plating layer 5 or the like is inevitable as shown in FIG. 3B or 3C. However, in the probe 10 of the first embodiment, it is possible to uniformly disperse the load on the forward end portion of the probe 10 when it is brought into contact with the object of inspection. For, as shown in FIG. 2A, a plurality of the square-pyramidal protrusions 1 of this embodiment are formed in a lattice-like fashion. As a result, in the probe 10 of this embodiment, it is possible to delay the progress of wear of the gold plating layer 5.

As described above, in the probe 10 of the first embodiment, it is possible to uniformly disperse the load when it is brought into contact with the object of inspection. This makes it possible to delay the rate at which the wear of the gold plating layer 5 progresses. As a result, it is possible to obtain contact stability for the probe 10 and to effectively increase the service life thereof.

Embodiment 2

Figure 4A:
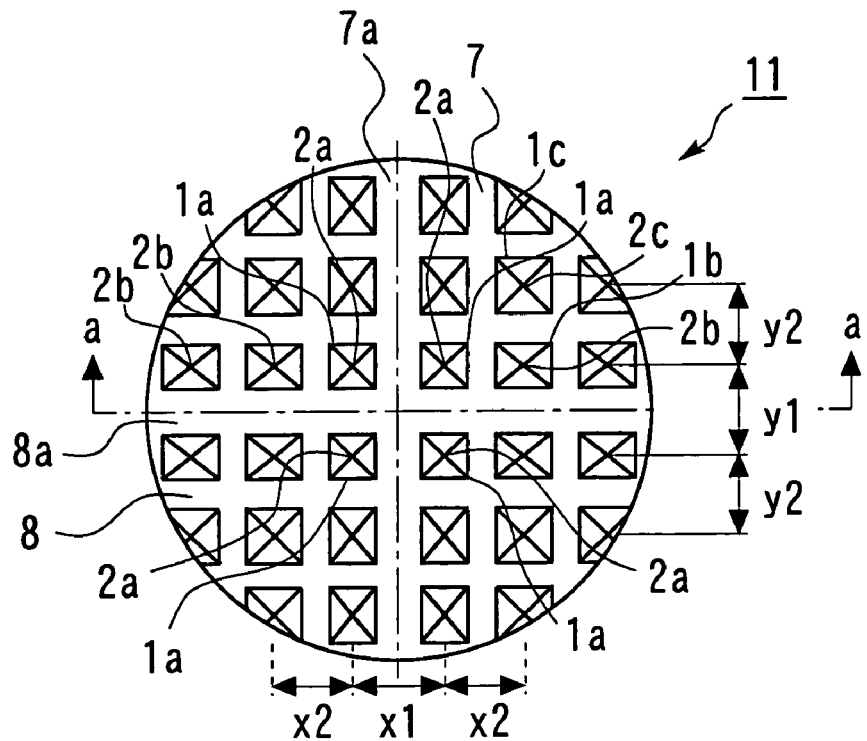
FIG. 4A is an enlarged view of a forward end portion of a probe 11 according to a second embodiment.
Figure 4B:
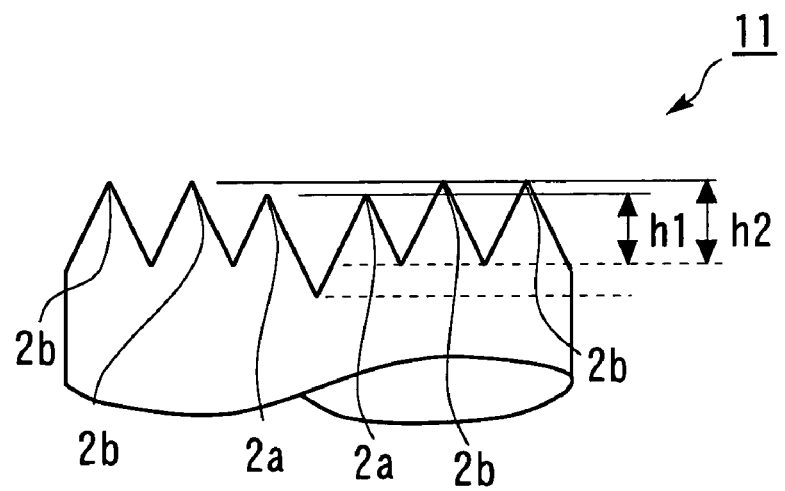
FIG. 4B is a sectional view taken along the line a-a of FIG. 4A.

Next, a probe 11 according to a second embodiment will be described with reference to the drawings. FIGS. 4A and 4B are enlarged views of a forward end portion of the probe 11 of the second embodiment. FIG. 4A is an enlarged view of the forward end portion of the probe 11 of the second embodiment. FIG. 4B is a sectional view taken along the line a-a of FIG. 4A. Except for the configuration of the forward end portion of the probe 11, this probe is of the same configuration as the probe 10 of the first embodiment that has already been described. Thus, as in the probe 10 of the first embodiment, the spring 30 is connected to the opposite side of the forward end portion of the probe 11, and these are contained in the sleeve 20. The sleeve 20 containing the probe 11 is attached to the inspection device. As a result, it is possible to inspect the object of inspection by the sleeve 11 (see FIG. 1).

As shown in FIG. 4A, at the forward end of the probe 11 of the second embodiment, there are formed a plurality of square-pyramidal protrusions 1a, 1b, and 1c of different sizes in a lattice-like fashion. That is, the probe 11 of the second embodiment differs from the probe 10 of the first embodiment, which is formed by the pyramidal protrusions 1 of the same size. To be more specific, of the plurality of square-pyramidal protrusions 1a, 1b, and 1c formed at the forward end of the probe 11, a height h1 of the square-pyramidal protrusions 1a situated near the center is formed to be smaller than that of the other square-pyramidal protrusions 1b and 1c. Thus, the apexes 2b and 2c of the square-pyramidal protrusions 1b and 1c come into contact with the object of inspection first. As a result of repeated contact, the outermost gold plating layers are worn by h2-h1. After that, the apexes 2a of the square-pyramidal protrusions 1a begin to come into contact with the object of inspection. That is, after the outermost gold plating layers of the apexes 2b and 2c have been worn, the outermost gold plating layers of the apexes 2a begin to come into contact with the object of inspection. As a result, in the probe 11 as a whole, the exposure of the ground layer can be delayed. As a result, it is possible to use the probe 11 for a long period of time. The square-pyramidal protrusions 1a are adjacent to both of two groove portions 7a and 8a crossing each other at the center of the forward end surface of the probe 11 so as to be perpendicular to each other. The square-pyramidal protrusions 1b are adjacent to one of the two groove portions 7a and 8a, for example, the groove portion 8a formed to extend in the horizontal direction in FIG. 4A. The square-pyramidal protrusions 1c are adjacent to none of the two groove portions 7a and 8a.

The distances x1 and y1 between the apexes of the square protrusions 1a with the smaller height and the pyramidal protrusions 1b or 1c with the larger height are larger than the distances x2 and y2 between the apexes of the pyramidal protrusions 1b and 1c with the larger height. That is, the distances between the square-pyramidal protrusions 1a, 1b, and 1c differ from each other. In this point, the probe 11 of the second embodiment differs from the probe 10 of the first embodiment. However, this embodiment is the same as the first embodiment in that a plurality of square-pyramidal protrusions 1a, 1b, and 1c are arranged regularly. Thus, it is possible to uniformly disperse the load on the forward end portion of the probe 11 when it is brought into contact with the object of inspection.

As described above, according to the probe 11 of the second embodiment, in addition to the effect of the probe 10 of the first embodiment mentioned above, it is possible to vary the contributions of the higher pyramidal protrusions and the lower pyramidal protrusions with respect to the object of inspection. That is, at the point in time when the apex of the lower pyramidal protrusions begin to come into contact with the object of inspection, it is possible to cause transition in contact contribution with respect to the object of inspection from a state in which the contact contribution of the higher pyramidal protrusions is higher to a state in which the contact contribution of the lower pyramidal protrusions is higher. As a result, it is possible to effectively increase the contact stability and the service life of the probe 11. Further, even when the gold plating layers 5 of the higher pyramidal protrusions 1b or 1c have been worn to expose the nickel plating layers 4, it is possible to inspect the object of inspection by means of the gold plating layers 5 of the lower pyramidal protrusions 1a. As a result, it is possible to inspect the object of inspection in a state in which the contribution of the gold plating layers 5 is high. While in the embodiment described above two kinds of probes of different heights are provided on the probe, it is also possible to provide the probe with three kinds or more of probes of different heights.

Embodiment 3

Next, a method of manufacturing the probes 10 and 11 of the first and second embodiments will be described with reference to the drawings.

Figure 5:
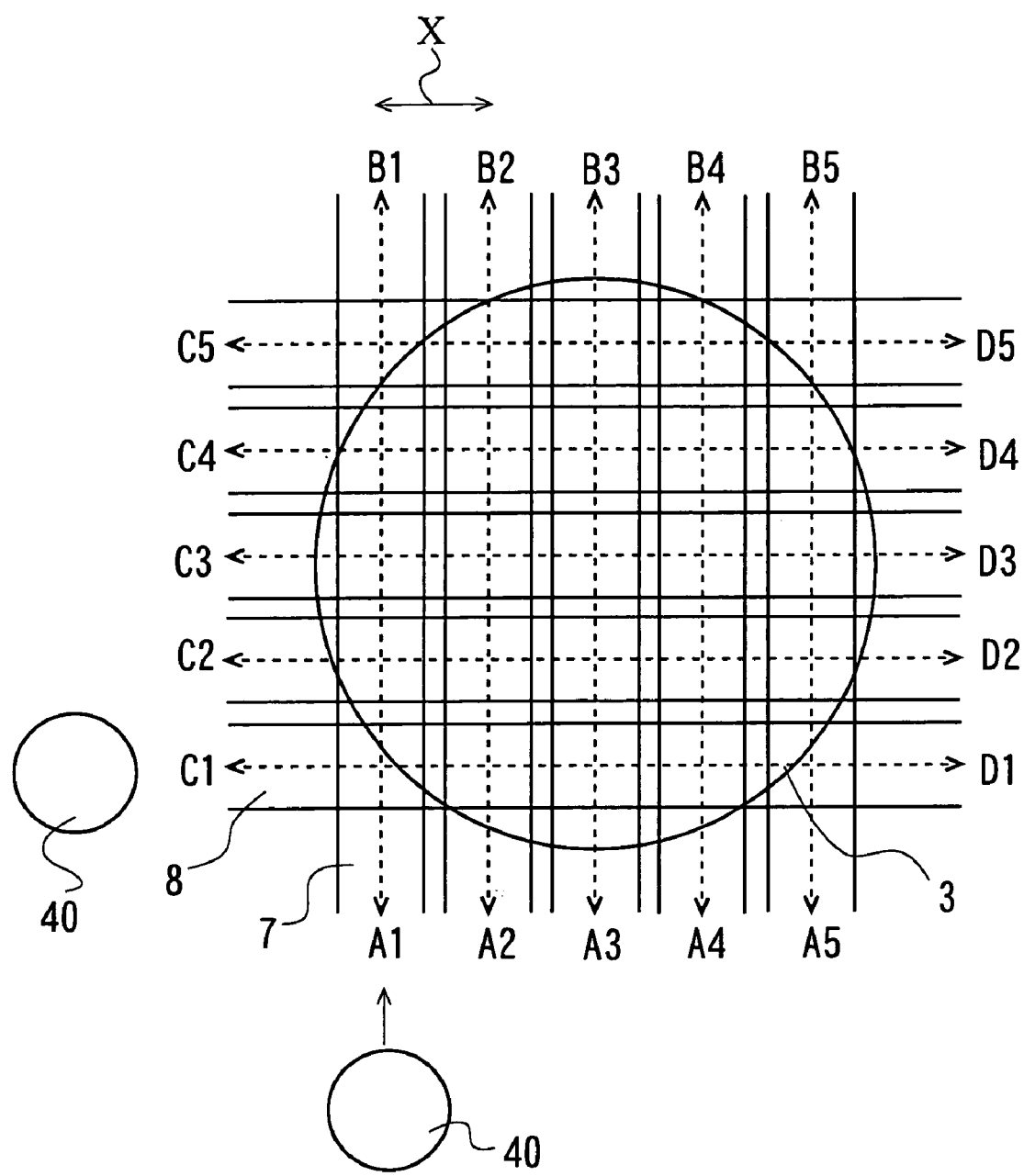
FIG. 5 is a diagram showing a working procedure for forming the probe 10 of the first embodiment.

FIG. 5 is a diagram illustrating a working procedure for the probe 10 of the first embodiment. First, a bar-shaped base member 3 is fixed in position by using a jig. Next, a grindstone 40 whose section passing the rotation axis is substantially V-shaped is brought into contact with one end surface of the base member 3 fixed in position while being rotated at high speed so as to be substantially perpendicular thereto. Then, cutting is started by moving the grindstone 40 from A1 toward B1 so as to form a linear first groove portion 7. The grindstone 40 is caused to make a linear reciprocal movement on a segment A1B1 to form the first groove portion 7. After that, the grindstone 40 is moved to a position A2 adjacent to the segment A1B1 and is caused to advance toward a position B2. This operation is repeated to form five first groove portions 7 with a substantially V-shaped sectional configuration. In this process, the distance x between the forward ends of the grindstone 40 is set at the same value. Further, the cutting depth for the grindstone 40 is set at the same value.

Figure 6:
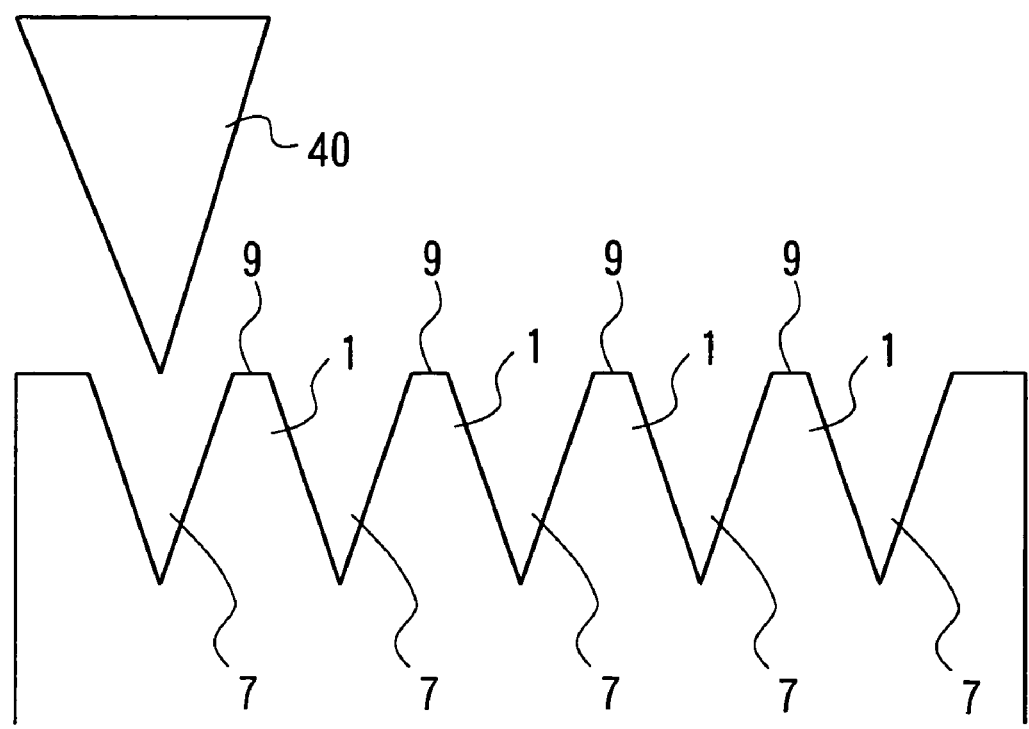
FIG. 6 is a diagram showing the working procedure for forming the probe 10 of the first embodiment.

Next, the grindstone 40 is moved to a position C1 so that the first groove portions 7 already formed are perpendicular, that is, at substantially 90 degrees, with respect to the second groove portions 8 to be formed next. Next, the second groove portions 8 are formed by the same procedure as that for forming the first groove portions 7. That is, the grindstone 40 is brought into contact with one end surface of the base member 3 while rotating at high speed so as to be substantially perpendicular thereto. Then, the grindstone 40 is caused to make a linear movement from C1 toward D1. The grindstone 40 is caused to make a linear movement on a segment C1D1 to form the first second groove portion 8. After that, the grindstone 40 is moved to a position C2 adjacent to the segment C1D1. This operation is repeated to form five second groove portions 8 with a substantially V-shaped sectional configuration. The pyramidal protrusions 1 of the probe 10 are of a square-pyramidal configuration. Thus, by forming a plurality of groove portions 7 and 8 orthogonal to each other, there are formed a plurality of square-pyramidal protrusions 1 between the groove portions. When forming minute flat portions 9 at the apexes 2 of the square-pyramidal-protrusions 1, the cutting depth for the grindstone 40 is made smaller. As a result, as shown in FIG. 6, part of the end surface of the base member 3 remains. As a result, the remaining flat surfaces serve as the minute flat portions 9. While in this embodiment the position of the grindstone 40 is shifted, this should not be construed restrictively. It is also possible, for example, to fix the cutting direction of the grindstone 40 and to rotate the base member 3 by substantially 90 degrees.

After the formation of the first groove portions 7 and the second groove portions 8, a nickel plating layer 4 constituting the ground layer is formed on the surface of the base member 3. Next, on the surface of the nickel plating layer 4, there is formed a gold plating layer 5 as the outermost layer. This makes it possible to manufacture a probe 10 equipped with two plating layers. The protrusions formed at the forward end of the probe 10 of the first embodiment are square-pyramidal protrusions 1. Thus, the process for forming groove portions is conducted twice. When forming triangular-pyramidal protrusions, the base member 3 has to be cut from three directions, so it is necessary to perform the process for forming groove protrusions one more time. In this case, it is desirable for the groove portions to be formed so as to be at substantially 60 degrees with respect to each other.

Figure 7:
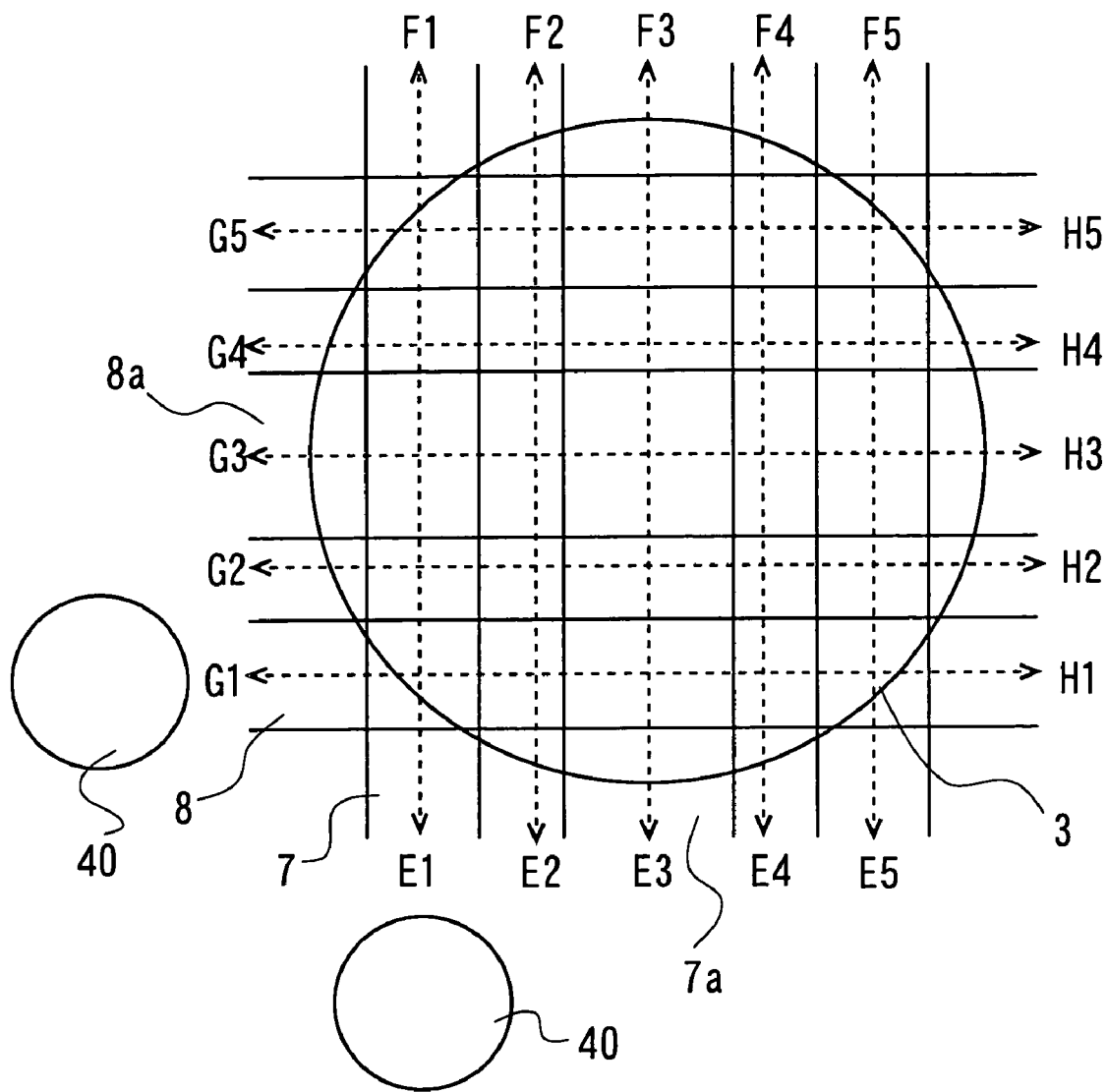
FIG. 7 is a diagram showing a working procedure for forming the probe 11 of the second embodiment.

Next, a method of manufacturing the probe 11 of the second embodiment will be described. FIG. 7 is a diagram illustrating a working procedure for the probe 11 of the second embodiment. First, the bar-shaped base member 3 is fixed in position by using a jig. Next, the grindstone 40 whose section passing the rotation axis is substantially V-shaped is brought into contact with one end surface of the fixed base member 3 while rotating it at high speed so as to be substantially perpendicular thereto. Then, the grindstone 40 is caused to advance from a position E1 toward a position F1 so as to form a linear first groove portion 7, and reciprocal movement is repeated on a segment E1F1. Next, the grindstone 40 is shifted to a position E2 adjacent to the segment E1F1, and is caused to advance toward a position F2, and reciprocal movement is repeated on a segment E2F2. Next, the grindstone 40 is shifted to a position E3 adjacent to the segment E2F2, and is caused to advance toward a position F3, and reciprocal movement is repeated on a segment E3F3. In this process, the cutting depth for the grindstone 40 is made relatively large in forming the first groove portion 7a. That is, the first groove portion 7a is formed deeper than the two first groove portions 7 previously formed. After the formation of the first groove portion 7a, the grindstone 40 is shifted to position E4. Then, the grindstone is caused to make reciprocal movement on the segment E4F4 to form the third first groove portion 7 with the same depth as the preceding ones. After that, the grindstone 40 is shifted to a position E5 adjacent to the segment E4F4, and caused to advance toward a position F5 and make reciprocal movement on a segment E5F5. By this process, it is possible to make solely the height of the apexes adjacent to the deeper groove portion 7a small.

Next, the grindstone 40 is shifted to a position G1 so that the first groove portions 7 and 7a already formed are perpendicular, that is, at substantially 90 degrees to the second groove portions 8 and 8a to be formed next. Next, the second groove portions 8 and 8a are formed by the same procedure as that for the first groove portions 7 and 7a. That is, the grindstone 40 is brought into contact with one end surface of the base member 3 fixed in position while rotating at high speed so as to be substantially perpendicular thereto. Then, to form a linear second groove portion 8, the grindstone 40 is caused to advance from the position G1 toward a position H1 and make reciprocal movement on a segment G1H1. Next, the grindstone 40 is shifted to position G2 adjacent to the segment G1H1, and is caused to advance toward a position H2 and make reciprocal movement on a segment G2H2. Next, the grindstone 40 is shifted to a position G3 adjacent to the segment G2H2, and is caused to advance toward a position H3 and make reciprocal movement on a segment G3H3. In this process, the cutting depth for the grindstone 40 is made larger to form the second groove portion 8a. After the formation of the second groove portion 8a, the grindstone 40 is shifted to a position G4 adjacent to the segment G3H3. Then, the grindstone is caused to make reciprocal movement on the segment G4H4 to form the third second groove portion 8 with the same cutting depth as the preceding ones. After that, the grindstone 40 is shifted to a position G5 adjacent to a segment G4H4, and is caused to advance toward a position H5 and make reciprocal movement on a segment G5H5. By this process, it is possible to make solely the height of the apexes adjacent to the deeper second groove portion 8a small.

By this method, it is possible to adjust the protrusion height according to the depth of the groove to be formed, making the height of the square-pyramidal protrusion 1a near the center smaller than the height of the other pyramidal protrusions 1b and 1c. After the formation of the square-pyramidal protrusions 1a, 1b, and 1c, a plating layer is formed by the same method as the method of forming the probe 10 of the first embodiment.

Figure 8:
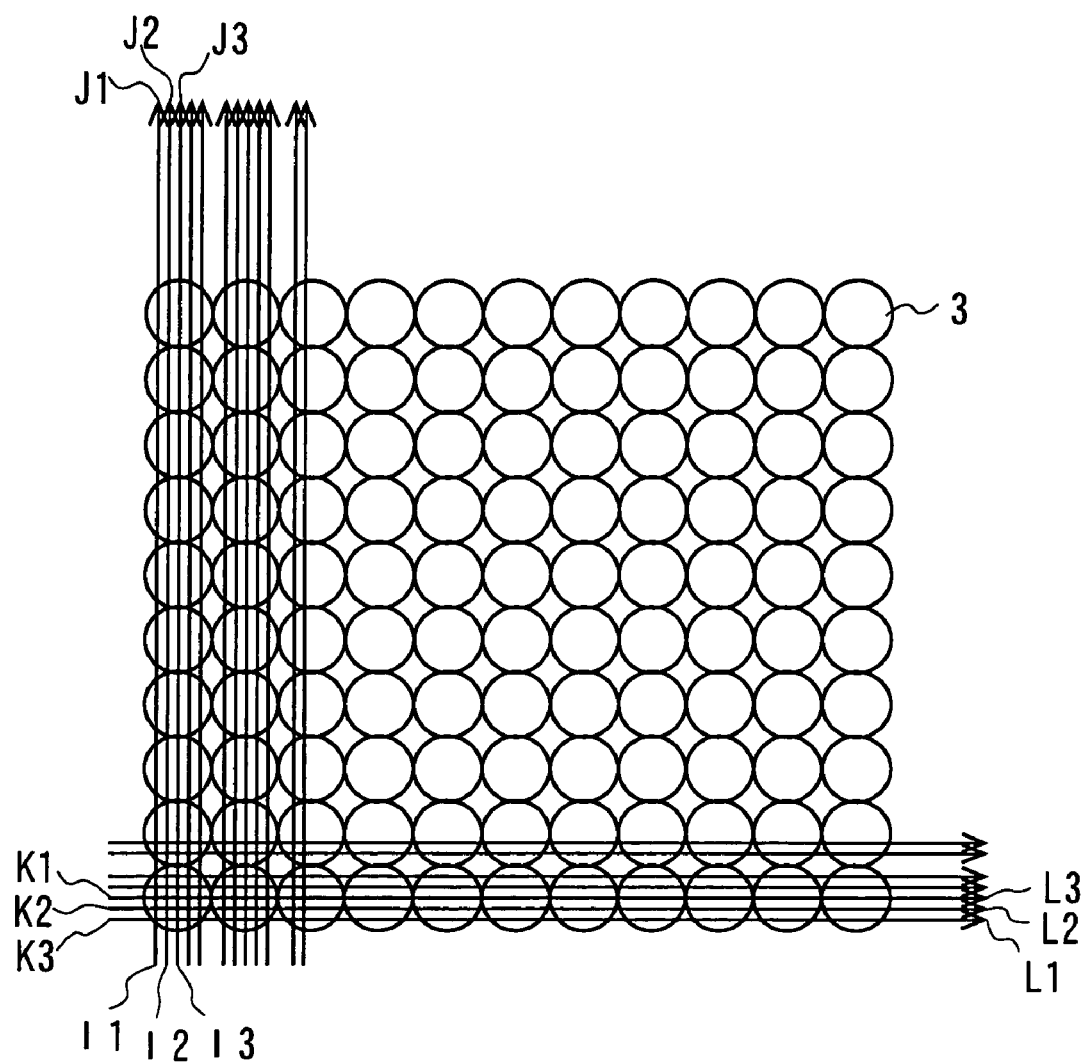
FIG. 8 is a diagram showing a working procedure for simultaneously manufacturing a plurality of probes 10 of the first embodiment and a plurality of probes 11 of the second embodiment.
Figure 9A:
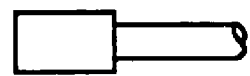
FIG. 9A is a diagram showing a flat configuration of forward end portions of conventional probes.
Figure 9B:
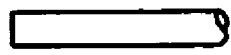
FIG. 9B is a diagram showing a flat configuration of forward end portions of conventional probes.
Figure 9C:
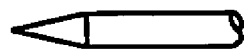
FIG. 9C is a diagram showing a conical configuration of forward end portions of conventional probes.
Figure 9D:
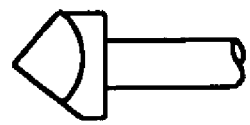
FIG. 9D is a diagram showing a pyramidal configuration of forward end portions of conventional probes.
Figure 9E:
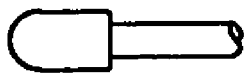
FIG. 9E is a diagram showing a rounded configuration of forward end portions of conventional probes.
Figure 9F:
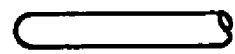
FIG. 9F is a diagram showing a rounded configuration of forward end portions of conventional probes.
Figure 9G:
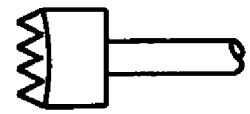
FIG. 9G is a diagram showing a crown-shaped configuration of forward end portions of conventional probes.
Figure 9H:
FIG. 9H is a diagram showing a cup-shaped configuration of forward end portions of conventional probes.

Next, a case will be described in which a plurality of probes 10 according to the first embodiment and a plurality of probes 11 according to the second embodiment are manufactured simultaneously. FIG. 8 is a diagram illustrating a working procedure for simultaneously manufacturing a plurality of probes 10 according to the first embodiment and a plurality of probes 11 according to the second embodiment. First, a plurality of bar-shaped base members 3 are prepared, and are arranged so as to be in close contact with each other in a matrix-like fashion and fixed in position by a jig. As an example of the jig, it is possible to use one having a fixing member for fixing a plurality of bar-shaped base members 3 in the form of a plurality of bundles. The jig may also be one having hole portions arranged in a matrix-like fashion. By fixing the bar-shaped base members 3 to the respective hole portions, it is possible to fix a plurality of base members 3 to the jig.

Next, the grindstone 40 is arranged at a position I1, and cutting is effected toward a position J1. This cutting operation is effected in the same manner as in the method of manufacturing the probe 10 of the first embodiment or the probe 11 of the second embodiment. As a result, it is possible to form a plurality of first groove portions 7. It is also possible to arrange a plurality of grindstones 40 in parallel. By thus forming a plurality of groove portions simultaneously, it is possible to shorten the operation time.

Next, the grindstone 40 is set at position K1 so that the first groove portions 7 already formed and the second groove portions 8 to be formed next are orthogonal, that is, at substantially 90 degrees, to each other. Then, the second groove portions are formed by the manufacturing method for the probe 10 of the first embodiment or the probe 11 of the second embodiment. When the formation of the second groove is completed, a plating layer is formed in the same manner as in the manufacturing method for the probe 10 of the first embodiment, thereby completing the operation.

By the probe manufacturing method described above, it is possible to efficiently manufacture probes according to the first and second embodiments. Further, by fixing together a plurality of bar-shaped members 3 in close contact with each other in a matrix-like fashion and performing working thereon, it is possible to efficiently manufacture a plurality of probes according to the first and second embodiments. Further, by repeatedly performing the process for forming the second groove portions, it is also possible to form pentagonal-pyramidal protrusions. Further, by increasing the number of times that this process is repeated, it is also possible to finally form substantially conical protrusions.

The probe and the method of manufacturing a probe of the present invention are not restricted to the preferred embodiments described above, but may include, as far as possible, combinations thereof.

OTHERS

The disclosures of Japanese patent application No. JP2006-038066 filed on Feb. 15, 2006 including the specification, drawings and abstract are incorporated herein by reference.

What is claimed is:

1. A probe to be used when inspecting electrical characteristics of an object of inspection, comprising:
    a bar-shaped base member forming a main body;
    a plating layer formed on a surface of the base member;
    a plurality of first protrusions formed at one end of the base member, first protrusions having a first height and being brought into contact with the object of inspection;
    a gold plating layer formed on a peak of the first protrusions; and
    a plurality of second protrusions formed at the one end of the base member, the second protrusions having a second height and being brought into contact with the object of inspection, the second height being less than the first height by a distance corresponding to a thickness of the gold plating layer.

2. A probe according to claim 1, wherein at least one of the plurality of first and second protrusions are conical/pyramidal protrusions which are of a conical or a pyramidal configuration.

3. A probe according to claim 2, wherein the conical/pyramidal protrusions have at their forward ends minute flat portions adapted to be brought into contact with an inspection surface of the object of inspection so as to be substantially parallel to the inspection surface at the time of inspection.

4. A probe, comprising:
    a first conical/pyramidal protrusion at a forward end of the probe, the first conical/pyramidal protrusion has a first height and a peak of the first conical/pyramidal protrusion includes a gold plating layer;
    a second conical/pyramidal protrusion differing from the first conical/pyramidal protrusion at a forward end of the probe, the second conical/pyramidal protrusion has a second height and the second height differs from the first height by a distance corresponding to a thickness of the cold plating layer.

5. The probe according to claim 4, wherein the second height is less than the first height by the distance corresponding to the thickness of the gold plating layer.

* * * * *